United States Patent
Aoyama et al.

(10) Patent No.: US 9,196,821 B2
(45) Date of Patent: Nov. 24, 2015

(54) ELECTROMECHANICAL TRANSDUCER, DROPLET EJECTION HEAD, AND METHOD FOR MANUFACTURING ELECTROMECHANICAL TRANSDUCER

(71) Applicants: Tsutoh Aoyama, Kanagawa (JP); Masaru Shinkai, Kanagawa (JP); Masahiro Ishimori, Tokyo (JP); Keiji Ueda, Kanagawa (JP); Kanshi Abe, Kanagawa (JP); Manabu Nishimura, Hyogo (JP); Toshiaki Masuda, Kanagawa (JP)

(72) Inventors: Tsutoh Aoyama, Kanagawa (JP); Masaru Shinkai, Kanagawa (JP); Masahiro Ishimori, Tokyo (JP); Keiji Ueda, Kanagawa (JP); Kanshi Abe, Kanagawa (JP); Manabu Nishimura, Hyogo (JP); Toshiaki Masuda, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 14/322,032

(22) Filed: Jul. 2, 2014

(65) Prior Publication Data
US 2015/0022592 A1    Jan. 22, 2015

(30) Foreign Application Priority Data
Jul. 16, 2013 (JP) .................. 2013-147730

(51) Int. Cl.
*B41J 2/045* (2006.01)
*H01L 41/31* (2013.01)
*B41J 2/14* (2006.01)
*H01L 41/09* (2006.01)
*H01L 41/316* (2013.01)
*H01L 41/318* (2013.01)

(52) U.S. Cl.
CPC ............. *H01L 41/31* (2013.01); *B41J 2/14201* (2013.01); *B41J 2/14233* (2013.01); *H01L 41/0973* (2013.01); *H01L 41/316* (2013.01); *H01L 41/318* (2013.01); *B41J 2202/03* (2013.01)

(58) Field of Classification Search
CPC .................................................... B41J 2/14201
See application file for complete search history.

(56) References Cited

U.S. PATENT DOCUMENTS

2005/0264617 A1   12/2005   Nishimura et al.
2008/0309734 A1   12/2008   Nishimura et al.
(Continued)

FOREIGN PATENT DOCUMENTS

JP    2001-088294    4/2001
JP    2003-188431    7/2003
(Continued)

OTHER PUBLICATIONS

U.S. Appl. No. 14/208,004, filed Mar. 13, 2014.
(Continued)

*Primary Examiner* — Geoffrey Mruk
(74) *Attorney, Agent, or Firm* — Cooper & Dunham LLP (57) ABSTRACT

An electromechanical transducer includes a first electrode mounted on one of a substrate and a base film, an electromechanical transducer film mounted on the first electrode and made of a piezoelectric substance having a perovskite crystal structure, and a second electrode mounted on the electromechanical transducer film. The electromechanical transducer film includes a {100} plane preferentially oriented to be orthogonal to a thickness direction of the electromechanical transducer film and has a full width at half maximum corresponding to a {200} plane in an X-ray diffraction measurement curve in 2θ-ω scan that is measured by emitting an X-ray beam onto a surface of the electromechanical transducer film at an incident angle θ. The full width at half maximum is not greater than 10 degrees.

6 Claims, 7 Drawing Sheets

(56) References Cited

U.S. PATENT DOCUMENTS

| | | |
|---|---|---|
| 2009/0121374 A1* | 5/2009 | Shibata et al. ............... 264/40.1 |
| 2009/0289998 A1 | 11/2009 | Tanaka et al. |
| 2011/0102515 A1* | 5/2011 | Asaoka et al. ................. 347/68 |
| 2011/0175987 A1 | 7/2011 | Machida et al. |
| 2012/0038712 A1 | 2/2012 | Akiyama et al. |
| 2012/0212545 A1 | 8/2012 | Mizukami et al. |
| 2012/0229573 A1 | 9/2012 | Mizukami et al. |
| 2012/0236067 A1 | 9/2012 | Tajima et al. |
| 2012/0236083 A1 | 9/2012 | Mizukami et al. |
| 2013/0002767 A1 | 1/2013 | Mizukami et al. |
| 2013/0070029 A1 | 3/2013 | Mizukami et al. |
| 2013/0162726 A1 | 6/2013 | Mizukami et al. |
| 2013/0250007 A1 | 9/2013 | Ishimori et al. |
| 2013/0250008 A1 | 9/2013 | Ohnishi et al. |
| 2013/0250009 A1 | 9/2013 | Ishimori et al. |

FOREIGN PATENT DOCUMENTS

| | | |
|---|---|---|
| JP | 2004-104066 | 4/2004 |
| JP | 2006-278489 | 10/2006 |
| JP | 2008-028030 | 2/2008 |
| JP | 2008-192868 | 8/2008 |
| JP | 2011-181720 | 9/2011 |
| JP | 2012-253161 | 12/2012 |

OTHER PUBLICATIONS

U.S. Appl. No. 14/206,092, filed Mar. 12, 2014.

\* cited by examiner

ELECTROMECHANICAL TRANSDUCER, DROPLET EJECTION HEAD, AND METHOD FOR MANUFACTURING ELECTROMECHANICAL TRANSDUCER

CROSS-REFERENCE TO RELATED APPLICATION

This patent application is based on and claims priority pursuant to 35 U.S.C. §119(a) to Japanese Patent Application No. 2013-147730, filed on Jul. 16, 2013, in the Japan Patent Office, the entire disclosure of which is hereby incorporated by reference herein.

BACKGROUND

1. Technical Field

This disclosure relates to an electromechanical transducer, a droplet ejection head, and a method for manufacturing the electromechanical transducer, and more specifically to an electromechanical transducer including an electromechanical transducer film, a droplet ejection head incorporating the electromechanical transducer, and a method for manufacturing the electromechanical transducer.

2. Description of the Related Art

Related-art image forming apparatuses, such as copiers, facsimile machines, printers, or multifunction printers having two or more of copying, printing, scanning, facsimile, plotter, and other functions, typically form an image on a recording medium according to image data by an inkjet method using ink.

For example, such image forming apparatuses may include a droplet ejection apparatus incorporating a droplet ejection head that ejects ink droplets onto a recording medium to form an image on the recording medium. The droplet ejection head includes a nozzle that ejects droplets, a pressure chamber in communication with the nozzle, and a pressure generator that presses against liquid contained in the pressure chamber. The pressure generator includes a piezoelectric, electromechanical transducer, having an electromechanical transducer film made of a piezoelectric substance, mounted on a diaphragm constituting a part of a wall of the pressure chamber. The piezoelectric, electromechanical transducer employs a longitudinal oscillation mode (e.g., a push mode) or a transverse oscillation mode. The longitudinal oscillation mode uses compression and expansion of the electromechanical transducer film in a thickness direction thereof, that is, a direction of an electric field. The transverse oscillation mode uses compression and expansion of the electromechanical transducer film in a direction orthogonal to the thickness direction thereof. Since the entire electromechanical transducer film vibrates as if it bends in the transverse oscillation mode, the transverse oscillation mode is also called a flexural oscillation mode or a bend mode. As the electromechanical transducer deforms in those oscillation modes, the diaphragm mounting the electromechanical transducer is displaced and pressed against liquid inside the pressure chamber.

The piezoelectric substance of the electromechanical transducer film is made of lead zirconate titanate (PZT) having a perovskite crystal structure. The PZT has main crystal planes of a {100} plane, a {110} plane, and a {111} plane. The electromechanical transducer film made of the PZT uses the {100} plane and the {111} plane mainly among the three main crystal planes, that are oriented to be orthogonal to the thickness direction of the electromechanical transducer film, thus producing a PZT film.

For example, JP-2003-188431-A and JP-2004-104066-A disclose the PZT film in which a (100) plane is oriented to be orthogonal to the thickness direction of the electromechanical transducer film. JP-2008-192868-A discloses a piezoelectric substance film that has a crystalline orientation in which the (100) plane is orthogonal to the thickness direction of the piezoelectric substance film and a full width at half maximum, that is, a half peak width, not smaller than 3 degrees in an X-ray diffraction rocking curve method.

The electromechanical transducer including the piezoelectric substance film in which the {100} plane is orthogonal to the thickness direction of the film deforms in a substantial amount when it is applied with voltage during an early stage after manufacturing. However, the amount of deformation of the electromechanical transducer may degrade over time. For example, when a driving voltage for driving the electromechanical transducer is applied to the electromechanical transducer repeatedly, the electromechanical transducer may deform in a decreased amount over time as it is applied with a predetermined driving voltage. As the amount of deformation of the electromechanical transducer decreases, the electromechanical transducer may displace the diaphragm insufficiently and therefore the diaphragm may press against liquid in the pressure chamber insufficiently.

SUMMARY

In at least one exemplary embodiment of this disclosure, there is provided an electromechanical transducer including a first electrode mounted on one of a substrate and a base film, an electromechanical transducer film mounted on the first electrode and made of a piezoelectric substance having a perovskite crystal structure, and a second electrode mounted on the electromechanical transducer film. The electromechanical transducer film includes a {100} plane preferentially oriented to be orthogonal to a thickness direction of the electromechanical transducer film and has a full width at half maximum corresponding to a {200} plane in an X-ray diffraction measurement curve in 2θ-ω scan that is measured by emitting an X-ray beam onto a surface of the electromechanical transducer film at an incident angle θ. The full width at half maximum is not greater than 10 degrees.

In at least one exemplary embodiment of this disclosure, there is provided a droplet ejection head including a nozzle to eject liquid, a pressure chamber, in communication with the nozzle, to contain the liquid, and a pressure generator to press against the liquid in the pressure chamber. The pressure generator includes a diaphragm abutting the pressure chamber to press against the liquid in the pressure chamber and an electromechanical transducer mounted on the diaphragm. The electromechanical transducer includes a first electrode mounted on one of a substrate and a base film, an electromechanical transducer film mounted on the first electrode and made of a piezoelectric substance having a perovskite crystal structure, and a second electrode mounted on the electromechanical transducer film. The electromechanical transducer film includes a {100} plane preferentially oriented to be orthogonal to a thickness direction of the electromechanical transducer film and has a full width at half maximum corresponding to a {200} plane in an X-ray diffraction measurement curve in 2θ-ω scan that is measured by emitting an X-ray beam onto a surface of the electromechanical transducer film at an incident angle θ. The full width at half maximum is not greater than 10 degrees.

In at least one exemplary embodiment of this disclosure, there is provided a method for manufacturing an electromechanical transducer. The method includes steps of producing a first electrode on one of a substrate and a base film and producing an electromechanical transducer film on the first electrode. The electromechanical transducer film is made of a piezoelectric substance having a perovskite crystal structure in which a {100} plane as a crystal plane is preferentially oriented to be orthogonal to a thickness direction of the electromechanical transducer film. A full width at half maximum corresponding to a {200} plane in an X-ray diffraction measurement curve in 2θ-ω scan that is measured by emitting an X-ray beam onto a surface of the electromechanical transducer film at an incident angle θ is not greater than 10 degrees.

BRIEF DESCRIPTION OF THE SEVERAL VIEWS OF THE DRAWINGS

The aforementioned and other aspects, features, and advantages of the present disclosure would be better understood by reference to the following detailed description when considered in connection with the accompanying drawings, wherein.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner and achieve similar results.

The term "image formation" used herein includes providing not only meaningful images, such as characters and figures, but meaningless images, such as patterns, to print media (in other words, the term "image formation" also includes causing liquid droplets to land on print media).

The term "ink" is not limited to "ink" in a narrow sense, unless specified, but is used as a generic term for any types of liquid usable as targets of image formation. For example, the term "ink" includes recording liquid, fixing solution, liquid, and so on.

The term "image forming apparatus", unless specified, also includes both serial-type image forming apparatus and line-type image forming apparatus.

Although the exemplary embodiments are described with technical limitations with reference to the attached drawings, such description is not intended to limit the scope of the disclosure and all of the components or elements described in the exemplary embodiments of this disclosure are not necessarily indispensable to the present disclosure.

Referring now to the drawings, wherein like reference numerals designate identical or corresponding parts throughout the several views, exemplary embodiments of the present disclosure are described below.

In the description below, a <hkl> direction denotes a [hkl] direction and a plurality of directions equivalent to the [hkl] direction by symmetry not considering a direction of spontaneous polarization of a crystal of a piezoelectric substance.

The <hkl> direction may be the [hkl] direction and one of the plurality of directions equivalent to the [hkl] direction. Alternatively, the <hkl> direction may be the [hkl] direction and a plurality of directions selected from a plurality of crystal planes equivalent to the [hkl] direction.

Considering the direction of spontaneous polarization of the crystal of the piezoelectric substance, the [hkl] direction and the plurality of directions including the direction equivalent to the [hkl] direction that are represented by the <hkl> direction are distinguished from each other. For example, in a piezoelectric substance having a perovskite crystal structure, by considering the direction of spontaneous polarization, a [100] direction, a [001] direction, and a [010] direction that are represented by a <100> direction are distinguished from each other.

In the description below, a {hkl} plane denotes a (hkl) plane and a plurality of crystal planes equivalent to the (hkl) plane by symmetry not considering the direction of spontaneous polarization of the crystal of the piezoelectric substance.

The {hkl} plane may be the (hkl) plane and one of the plurality of crystal planes equivalent to the (hkl) plane. Alternatively, the {hkl} plane may be the (hkl) plane and a plurality of crystal planes selected from the plurality of crystal planes equivalent to the (hkl) plane.

For example, in the piezoelectric substance having the perovskite crystal structure, a {111} plane denotes a (111) plane and one or more of a plurality of crystal planes including other seven crystal planes equivalent to the (111) plane. A {100} plane denotes a (100) plane and one or more of a plurality of crystal planes including other five crystal planes equivalent to the (100) plane.

A {hkl} orientation denotes an orientation of the {hkl} plane oriented to be orthogonal to a thickness direction of an electromechanical transducer film. A (hkl) orientation denotes an orientation of the (hkl) plane oriented to be orthogonal to the thickness direction of the electromechanical transducer film. For example, a {100} orientation denotes an orientation of the {100} plane oriented to be orthogonal to the thickness direction of the electromechanical transducer film. A {111} orientation denotes an orientation of the {111} plane oriented to be orthogonal to the thickness direction of the electromechanical transducer film. A {200} orientation denotes an orientation of a {200} plane oriented to be orthogonal to the thickness direction of the electromechanical transducer film. Similarly, a (100) orientation denotes an orientation of the (100) plane oriented to be orthogonal to the thickness direction of the electromechanical transducer film. A (111) orientation denotes an orientation of the (111) plane oriented to be orthogonal to the thickness direction of the electromechanical transducer film. A (200) orientation denotes an orientation of a (200) plane oriented to be orthogonal to the thickness direction of the electromechanical transducer film.

A description is provided of exemplary embodiments applied to an electromechanical transducer as a component of a droplet ejection head installed in an inkjet recording apparatus serving as an image forming apparatus (e.g., a droplet ejection apparatus).

The inkjet recording apparatus achieves advantages of printing at high speed with reduced noise, flexibility in ink used therein as liquid to form an image, and handling plain paper available at reduced costs. Hence, the inkjet recording apparatus is deployed as a printer, a facsimile machine, a copier, a multifunction peripheral or a multifunction printer (MFP) having at least one of copying, printing, scanning, facsimile, and plotter functions, or the like.

The droplet ejection head of the inkjet recording apparatus includes a nozzle that ejects liquid droplets (e.g., ink droplets) that form an image on a recording medium (e.g., a sheet), a pressure chamber in communication with the nozzle and containing ink, and a pressure generator that generates pressure to eject ink from the pressure chamber. The pressure generator employs a piezoelectric method and includes a diaphragm constituting a part of a wall of the pressure chamber and an electromechanical transducer having a thin, electromechanical transducer film made of a piezoelectric substance that deforms the diaphragm. The electromechanical transducer, when it is applied with a predetermined voltage, deforms itself and moves a surface of the diaphragm with respect to the pressure chamber, thus exerting pressure to liquid in the pressure chamber. The pressure ejects a liquid droplet (e.g., an ink droplet) onto the recording medium through the nozzle in communication with the pressure chamber.

The piezoelectric substance constituting the electromechanical transducer film is a material having a piezoelectric property of deforming itself as it is applied with voltage. According to this exemplary embodiment, the piezoelectric substance is made of ternary metallic oxide having the perovskite crystal structure, for example, lead zirconate titanate (PZT:Pb ($Zr_x$, $Ti_{1-x}$)$O_3$. The electromechanical transducer incorporating the electromechanical transducer film (hereinafter referred to as a PZT film) made of PZT, when it is applied with a driving voltage, exhibits a plurality of oscillation modes: a longitudinal oscillation mode (e.g., a push mode) involving deformation in a film thickness direction under a piezoelectric constant d33; a transverse oscillation mode (e.g., a bend mode) involving bending under a piezoelectric constant d31; and a shear mode involving film shearing. The electromechanical transducer incorporating the PZT film is manufactured by using semiconductor processes and micro electro mechanical systems (MEMS) that produce the pressure chamber and the electromechanical transducer in a silicon (Si) substrate directly. Thus, the electromechanical transducer serves as a thin film piezoelectric actuator that generates pressure in the pressure chamber.

The electromechanical transducer incorporated in the droplet ejection head installed in the image forming apparatus (e.g., the inkjet recording apparatus) achieves properties of improving an amount of surface displacement as it is applied with the driving voltage and durability against degradation over time in surface displacement after continuous driving.

The amount of surface displacement of the electromechanical transducer under the driving voltage varies substantially depending on the volume of a liquid droplet ejected from the pressure chamber through the nozzle and the ejection speed of the liquid droplet. Accordingly, the amount of surface displacement of the electromechanical transducer is important to improve precision of the liquid droplet that lands on the recording medium and quality of an image formed by the liquid droplets. Moreover, it is also important to reduce energy consumption of the image forming apparatus (e.g., the droplet ejection apparatus).

On the other hand, durability of the electromechanical transducer against degradation over time in surface displacement after continuous driving is important to enhance reliability of the image forming apparatus as well as to improve quality of the image formed by the liquid droplets.

The electromechanical transducer according to this exemplary embodiment is configured as described below to increase the amount of surface displacement under the driving voltage and durability against degradation over time in surface displacement.

The PZT film incorporated in the electromechanical transducer according to this exemplary embodiment is made of a piezoelectric oxide. The piezoelectric oxide is a polycrystal having a {100} plane, a {110} plane, and a {111} plane that are orthogonal to a thickness direction of the PZT film. Among the {100} plane, the {110} plane, and the {111} plane, the {100} plane and the {111} plane orthogonal to the thickness direction of the PZT film contribute to surface displacement of the electromechanical transducer facing the pressure chamber. Accordingly, surface displacement of the electromechanical transducer is improved by controlling orientation of the {100} plane and the {111} plane while eliminating orientation of the {110} plane.

The PZT film is manufactured by various methods. For example, one of the {100} plane and the {111} plane is oriented to be orthogonal to the thickness direction of the PZT film. If the {100} plane is mainly orthogonal to the thickness direction of the PZT film, the amount of surface displacement of the PZT film increases under the driving voltage. However, degradation in surface displacement and frailty may increase. By contrast, if the {111} plane is mainly orthogonal to the thickness direction of the PZT film, the amount of surface displacement of the PZT film may decrease under the driving voltage although durability against degradation in surface displacement and frailty increase.

To address this circumstance, according to this exemplary embodiment, the PZT film in which the {100} plane is preferentially orthogonal to the thickness direction of the PZT film is used as an electromechanical transducer film constituting a piezoelectric actuator. The PZT film has a full width at half maximum corresponding to a {200} plane that is not greater than 10 degrees in a measurement curve in 2θ-ω scan using X-ray diffraction (XRD) that is measured by emitting an X-ray beam onto a film surface at an incident angle θ. Further, the full width at half maximum corresponding to the {200} plane is not smaller than 5 degrees.

An amount of deformation, that is, the amount of surface displacement, of the piezoelectric actuator incorporating the PZT film in the {100} orientation may decrease over time due to change in domain in the PZT film. For example, the amount of deformation of the piezoelectric actuator may decrease over time not only by crystallization, that is, variation in crystal plane, of the PZT film in the {100} orientation but also by change in domain in the PZT film.

Figure 1:
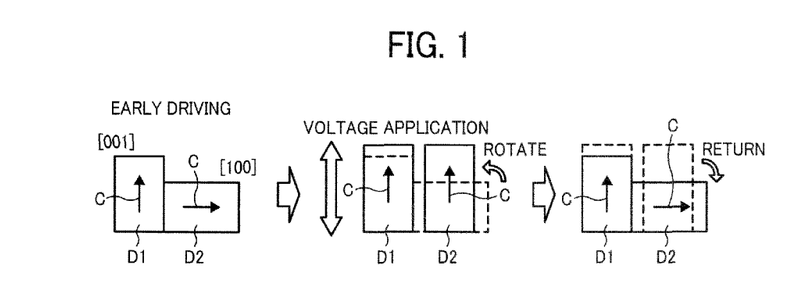
FIG. 1 is a schematic diagram illustrating change in domain in a PZT film in a {100} orientation in an early stage after manufacturing.

FIG. 1 is a schematic diagram illustrating change in domain in the PZT film in the {100} orientation in an early stage after manufacturing. The PZT film in the {100} orientation produced on a smooth substrate has a domain D1 in the (001) orientation and a domain D2 in the (100) orientation.

In the domain D1 in the (001) orientation, a [001] direction of the crystal is parallel to the thickness direction (hereinafter referred to as a longitudinal direction) of the PZT film. In the domain D1 in the (001) orientation, B ion (e.g., $Zr^{4+}$ ion and $Ti^{4+}$ ion) sitting in a B site at a center of a unit lattice of PZT is shifted in a spontaneous polarization direction C parallel to the longitudinal direction. The shifted B ion elongates the domain D1 in the (001) orientation, when spontaneously polarized, slightly longer than that, when not spontaneously polarized, in the longitudinal direction.

Conversely, in the domain D2 in the (100) orientation, the [001] direction of the crystal is orthogonal to the longitudinal direction and a [100] direction is parallel to the longitudinal direction. Considering symmetry of the crystal, the domain D2 is equivalent to the domain D1 in the (001) orientation. However, unlike the spontaneous polarization direction C of the domain D1, the spontaneous polarization direction C of the domain D2 in which B ion of the PZT film is shifted in the domain D2 in the (100) orientation is orthogonal to the thickness direction of the PZT film. The spontaneous polarization direction C of the domain D2 is hereinafter referred to as a transverse direction. The shifted B ion elongates the domain D2 in the (100) orientation, when spontaneously polarized, slightly longer than that, when not spontaneously polarized, in the transverse direction.

When voltage is applied to the PZT film mixed with the domains D1 and D2 in the longitudinal direction as shown in a center diagram in FIG. 1, the domain D1 in the (001) orientation is elongated slightly in the longitudinal direction. Conversely, the spontaneous polarization direction C in which B ion of the PZT film is shifted in the domain D2 in the (100) orientation rotates by 90 degrees from the transverse direction to the longitudinal direction. That is, the domain D2 deforms substantially as if it rotates by 90 degrees as shown in the center diagram in FIG. 1. The amount of deformation of the entire PZT film increases in proportion to an amount of deformation of the domain D2 in the (100) orientation.

Thereafter, when voltage application interrupts, the domains D1 and D2 recover their original shapes, respectively. For example, the spontaneous polarization direction C of the domain D2 in the (100) orientation rotates by 90 degrees to the original transverse direction as shown in a right diagram in FIG. 1. Thus, the domain D2 deforms substantially to recover its original shape.

As described above, when voltage is applied to the PZT film mixed with the domains D1 and D2, the spontaneous polarization direction C in which B ion in the domain D2 is shifted rotates and therefore the entire PZT film deforms substantially.

Figure 2:
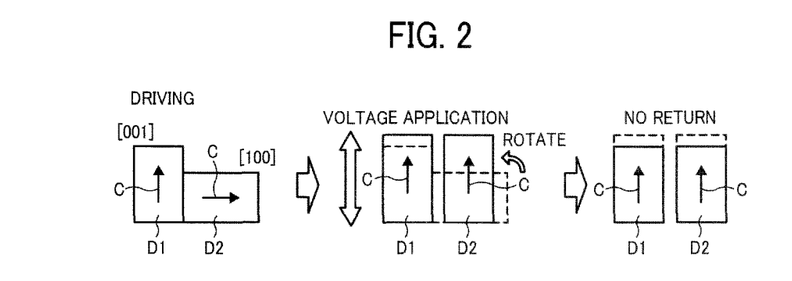
FIG. 2 is a schematic diagram illustrating change in domain in the PZT film in the {100} orientation when voltage is applied to the PZT film repeatedly.

FIG. 2 is a schematic diagram illustrating change in domain in the PZT film in the {100} orientation when voltage is applied to the PZT film repeatedly. When voltage is applied to the PZT film repeatedly, as shown in a right diagram in FIG. 2, even if voltage application interrupts, the spontaneous polarization direction C of the domain D2 in the (100) orientation does not recover its original transverse direction and therefore retains the longitudinal direction like the domain D1 in the (001) orientation. Accordingly, the spontaneous polarization direction C of the domains D1 and D2 is in the longitudinal direction, that is, the [001] direction. Hence, during voltage application, the domain D2 does not deform due to rotation of the spontaneous polarization direction C of the domain D2. Consequently, the amount of deformation of the PZT film decreases over time compared to that in the early stage after manufacturing shown in FIG. 1 involving rotation of the spontaneous polarization direction C of the domain D2.

To address this circumstance, according to this exemplary embodiment, the spontaneous polarization direction C, that is, the [001] direction, in the PZT film in the {100} orientation is in the thickness direction of the PZT film, that is, the longitudinal direction, thus increasing the abundance ratio of the domain D1. Accordingly, even after voltage is applied to the PZT film repeatedly, the amount of deformation of the PZT film does not decrease over time.

Determination on whether or not the spontaneous polarization direction C (e.g., the [001] direction) in the PZT film in the {100} orientation is in the thickness direction of the PZT film (e.g., the longitudinal direction), that is, whether or not the abundance ratio of the domain D1 is great, is performed by an X-ray diffraction measurement in 2θ-ω scan. The measurement in 2θ-ω scan is called a rocking curve measurement. For example, an incident angle θ and a diffraction angle 2θ in an X-ray detection direction with respect to a surface satisfying a diffraction condition for a crystal plane of a measuring object are determined. While the diffraction angle 2θ in the X-ray detection direction is fixed, an X-ray beam at an incident angle ω scans a predetermined range about the incident angle θ to detect the X-ray beam diffracted from the measuring object. In order to scan at the incident angle ω of the X-ray beam, an X-ray source may move or the surface of the measuring object may rotate. When the full width at half maximum corresponding to the {100} plane that is obtained by the X-ray diffraction measurement in 2θ-ω scan is small, the spontaneous polarization direction C (e.g., the [001] direction) is in the thickness direction of the PZT film. Conversely, when the full width at half maximum corresponding to the {100} plane is great, the spontaneous polarization direction C (e.g., the [001] direction) is not in the thickness direction of the PZT film.

It is to be noted that, according to this exemplary embodiment, the X-ray diffraction measurement in 2θ-ω scan uses diffraction on the {200} plane that is parallel to the {100} plane and has a decreased gap between the planes so as to detect a diffraction peak susceptible to change caused by shifting of B ion.

Figure 3:
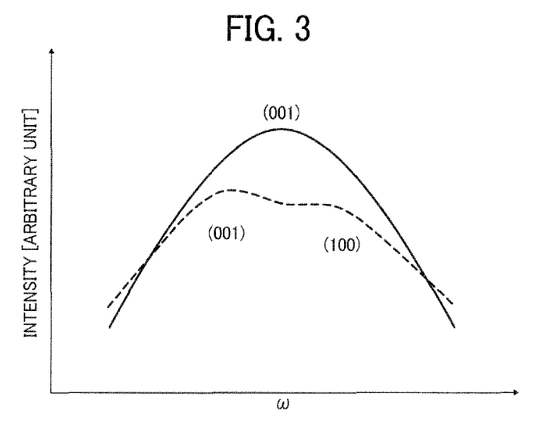
FIG. 3 is a graph illustrating one example of results of an X-ray diffraction measurement in 2θ-ω scan performed for a {200} plane of the PZT film.

FIG. 3 is a graph illustrating one example of results of the X-ray diffraction measurement in 2θ-ω scan performed for the {200} plane of the PZT film. When the domain D1 in the (001) orientation is mixed with the domain D2 in the (100) orientation, as shown in the dotted curve in FIG. 3, maximum values create two peaks of two mountains, respectively. Contrarily, when the spontaneous polarization direction C of the domain D1 in the (001) orientation is in the thickness direction of the PZT film, as shown in the solid curve in FIG. 3, a maximum value creates a single peak of a single mountain. Additionally, the spontaneous polarization direction C (e.g., the [001] direction) is in the thickness direction of the PZT film, decreasing the full width at half maximum thereof. By using this principle, according to this exemplary embodiment, crystallinity of the PZT film that is immune from decrease in the amount of deformation over time of the PZT film is defined based on the results of the X-ray diffraction measurement in 2θ-ω scan corresponding to the {200} plane. For example, as shown in examples below, the full width at half maximum corresponding to the {200} plane in a measurement curve in 2θ-ω scan using X-ray diffraction that is obtained by emitting an X-ray beam onto the surface of the PZT film at the incident angle θ is defined not smaller than 5 degrees and not greater than 10 degrees.

Figure 4:
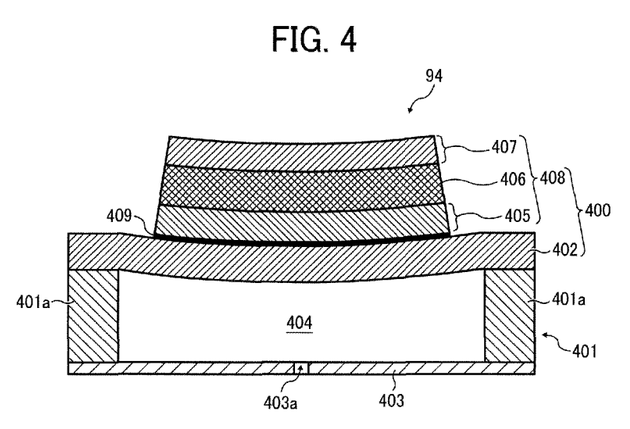
FIG. 4 is a schematic sectional view of a droplet ejection head according to an exemplary embodiment of the present disclosure.

With reference to FIG. 4, a description is provided of one example of a configuration of a droplet ejection head 94 incorporating a piezoelectric actuator as an electromechanical transducer 408.

FIG. 4 is a schematic sectional view of the droplet ejection head 94. As shown in FIG. 4, the droplet ejection head 94 includes a substrate 401, a nozzle plate 403, a pressure chamber 404, and a pressure generator 400. The pressure generator 400 includes a diaphragm 402, a base film 409, and the electromechanical transducer 408. The electromechanical transducer 408 includes a lower electrode 405 serving as a first electrode, a PZT film 406 serving as an electromechanical transducer film, and an upper electrode 407 serving as a second electrode. The pressure chamber 404 is enclosed by a wall 401a mounted on the nozzle plate 403, the diaphragm 402, and the nozzle plate 403 and in communication with a nozzle 403a produced in the nozzle plate 403.

A detailed description is now given of a configuration of the substrate 401.

The substrate 401 is made of silicon monocrystal and has a thickness in a range not smaller than 100 micrometers and not greater than 600 micrometers. The substrate 401 has three plane directions: a (100) plane, a (110) plane, and a (111) plane. In semiconductor industry, the (100) plane and the (111) plane are generally used. According to this exemplary embodiment, a monocrystal substrate using the (100) plane as a plane direction is employed. The pressure chamber 404 is manufactured by processing a silicon monocrystal substrate using etching, for example, anisotropic etching. Anisotropic etching provides a plurality of different etching rates for a plurality of plane directions of a crystal structure, respectively. For example, alkaline solution such as potassium hydroxide (KOH) displays an etch rate selectivity about 400 times smaller in the {111} plane than in the {100} plane. Accordingly, anisotropic etching fabricates a structure angled at about 54 degrees in the {100} plane and a deep groove in the {110} plane, achieving a high-density array while retaining rigidity. Alternatively, a monocrystal substrate using the {110} plane as a plane direction may be employed. However, in this case, it is to be noted that silicon dioxide ($SiO_2$) used as a mask material is also etched.

A detailed description is now given of a configuration of the diaphragm 402.

The diaphragm 402 deforms as it receives a force generated by the PZT film 406. For example, a surface of the diaphragm 402 abutting the pressure chamber 404 moves and presses against liquid contained in the pressure chamber 404, thus ejecting droplets through the nozzle 403a. Hence, the diaphragm 402 has a predetermined mechanical strength. The diaphragm 402 is made of silicon (Si), silicon dioxide ($SiO_2$), silicon nitride ($Si_3N_4$), or the like and manufactured by chemical vapor deposition (CVD). The diaphragm 402 is made of a material having a linear expansion coefficient similar to that of a material of the lower electrode 405 and the PZT film 406. Generally, the PZT film 406 is made of PZT. Hence, the diaphragm 402 is made of a material having a linear expansion coefficient similar to a linear expansion coefficient of $8\times10^{-6}$ [1/K], for example, not smaller than $5\times10^{-6}$ [1/K] and not greater than $10\times10^{-6}$ [1/K], and preferably not smaller than $7\times10^{-6}$ [1/K] and not greater than $9\times10^{-6}$ [1/K].

The diaphragm 402 is produced by layering a plurality of films having tensile stress or compressive stress by low pressure chemical vapor deposition (LP CVD). The reasons are as below. If the diaphragm 402 is constructed of a single layer film, it is made of a silicon on insulator (SOI) wafer, for example. In this case, the wafer costs substantially and does not afford arbitrary film stress to even flexural rigidity. Contrarily, if the diaphragm 402 is constructed of a plurality of layers, a multilayer construction is modified to attain flexibility in adjusting rigidity and film stress of the diaphragm 402 to desired values, respectively. That is, rigidity and stress of the entire diaphragm 402 are controlled by combination of multilayering, film thickness, and the multilayer construction. Accordingly, the diaphragm 402 attains flexibility for the material and the film thickness of an electrode layer and a ferroelectric layer constituting a piezoelectric actuator (e.g., a piezoelectric element). The diaphragm 402 is stably immune from fluctuation in rigidity and stress that may be caused by a burning temperature of the piezoelectric actuator (e.g., the piezoelectric element), improving accuracy in ejecting droplets onto the recording medium and thus attaining stability in performance of the droplet ejection head 94.

A detailed description is now given of a configuration of the lower electrode 405.

The lower electrode 405 serving as a first electrode is constructed of a metal layer, an adhesion layer, and a conductive oxide layer. The metal layer is made of platinum (Pt) having an increased heat resistance and a decreased reactivity. However, since platinum achieves an insufficient barrier to lead, the metal layer may be made of a platinum group element such as iridium and platinum-rhodium, an alloy of those, or the like. If the metal layer is made of platinum, platinum may degrade adhesion of the metal layer to a base film made of $SiO_2$. To address this circumstance, titanium (Ti), titanium oxide ($TiO_2$), tantalum (Ta), tantalum pentoxide ($Ta_2O_5$), tantalum nitride ($Ta_3N_5$), or the like is layered in advance. The lower electrode 405 is manufactured by a vacuum method such as spattering and vacuum deposition. The lower electrode 405 has a film thickness not smaller than 0.02 micrometers and not greater than 0.10 micrometers, preferably, not smaller than 0.05 micrometers and not greater than 0.10 micrometers. Considering fatigue characteristic of the PZT film 406 susceptible to deformation over time, an electrode made of conductive oxide such as strontium ruthenate may be provided between the lower electrode 405 and the PZT film 406.

A detailed description is now given of a configuration of the upper electrode 407.

The upper electrode 407 serving as a second electrode, like the lower electrode 405, is constructed of a metal layer made of platinum or the like. A buffer layer may be provided between a platinum film and the PZT film 406 to adhere the upper electrode 407 to the PZT film 406. The buffer layer is produced by layering conductive oxide such as strontium ruthenate, for example.

A detailed description is now given of a configuration of the PZT film 406.

The PZT film 406 is made of a piezoelectric substance having the perovskite crystal structure, for example, a solid solution made of lead zirconate ($PbZrO_3$) and titanic acid ($PbTiO_3$). The property of the PZT film 406 varies depending on the ratio of lead zirconate and titanic acid. The ratio of $PbZrO_3$ of 53 and $PbTiO_3$ of 47 exhibits an improved piezoelectric property, which is shown by a chemical formula of Pb$(Zr_{0.54}Ti_{0.46})O_3$, general PZT (53/47). Barium titanate or the like may be used as complex oxide other than PZT. In this case, a barium alkoxide compound or a titanalkoxide compound as a starting material may be dissolved in a common solvent to produce a precursor solution of barium titanate. Those materials, defined in a general formula $ABO_3$ where A denotes lead (Pb), barium (Ba), and strontium (Sr) and B denotes titanium (Ti), zirconium (Zr), tin (Sn), nickel (Ni), zinc (Zn), magnesium (Mg), and niobium (Nb), are complex oxide containing those substances as a main ingredient. For example, the materials are described as $(Pb_{1-x}, Ba_x)(Zr, Ti)O_3$ and $(Pb)(Zr_x, Ti_y, Nb_{1-x-y})O_3$. Pb at A site is partially replaced by Ba. Zr and Ti at B site are partially replaced by Nb. Such replacement is performed by material modification for application of deformation or displacement property of PZT. The PZT film 406 is produced by spin coater using a spattering or sol-gel method. In this case, patterning is needed and therefore a desired pattern is obtained by photolithography etching or the like.

If the PZT film 406 is produced by the sol-gel method, a lead acetate, zirconium alkoxide, or titanalkoxide compound as a starting material is uniformly dissolved in methoxyethanol as a common solvent to produce a precursor solution of PZT. Since metal alkoxide compounds are hydrolyzed readily by moisture in air, acetylacetone, acetic acid, diethanolamine, or the like as a stabilizer in an appropriate amount may be added in the precursor solution. In order to coat the entire substrate 401 with the PZT film 406, a coating film is produced by a solution coating method such as spin coating and various thermal treatments such as solvent drying, pyrolysis, and crystallization are conducted. While the coating film transforms into a crystallization film, the film shrinks. Accordingly, in order to produce a film free from crack, the density of the precursor is adjusted to obtain a film thickness not greater than 100 nanometers at a single process. The PZT film 406 has a film thickness not smaller than 0.5 micrometers and not greater than 5.0 micrometers, preferably, not smaller than 1.0 micrometer and not greater than 2.0 micrometers. When the film thickness of the PZT film 406 is smaller than the desired range described above, it is difficult to produce the pressure chamber 404 shown in FIG. 4. Conversely, when the film thickness of the PZT film 406 is greater than the desired range described above, the diaphragm 402 underneath the PZT film 406 may not be deformed or displaced readily, unstabilizing ejection of droplets. Further, the diaphragm 402 is displaced insufficiently. In addition, if the film thickness of the PZT film 406 is greater than the desired range described above, a plurality of layers is produced in an increased number of processes, elongating a time taken to perform the processes.

A description is provided of examples of a method for manufacturing the droplet ejection head 94 accompanied by comparative examples.

A detailed description is now given of a first example of the method for manufacturing the droplet ejection head 94.

A silicon wafer serving as a substrate mounts a multilayer film, serving as a diaphragm, constructed of a silicon dioxide ($SiO_2$) layer, a silicon (Si) layer, and a silicon nitride (SiN) layer. After the $SiO_2$ layer constituting an outermost surface is treated with plasma surface treatment, a titanium (Ti) layer, serving as an electrode base layer, having a thickness of about 50 nanometers is mounted on the $SiO_2$ layer. Thus, a titanium oxide ($TiO_2$) film is produced by rapid thermal annealing (RTA) at about 700 degrees centigrade. The $TiO_2$ film serves as an adhesion layer provided between the $SiO_2$ layer and a platinum (Pt) film. Subsequently, the Pt film, serving as a lower electrode, having a film thickness of about 150 nanometers is produced by spattering. Next, a Ti layer having a film thickness of about 10 nanometers is mounted on the Pt film by spattering to produce a $TiO_2$ layer serving as a nucleation layer and oxidized by RTA at about 700 degrees centigrade, thus producing a $TiO_2$ film.

Subsequently, as materials of the PZT film, a PZT precursor application liquid, that is, a PZT precursor solution, is prepared at a composition ratio (1) below.

$$Pb:Zr:Ti=150:53:47 \quad (1)$$

For example, the PZT precursor application liquid is composed as below. As a starting material, lead acetate trihydrate, isopropoxide titanium, and isopropoxide zirconium are prepared. Lead acetate crystallization water is dissolved in methoxyethanol and dehydrated. An amount of lead is excessively greater than stoichiometric composition to prevent degradation in crystallinity due to lack of lead during thermal treatment. Isopropoxide titanium and isopropoxide zirconium are dissolved in methoxyethanol, subject to alcohol exchange reaction and esterification, and mixed with a methoxyethanol solution dissolved with lead acetate so as to produce the PZT precursor solution. The PZT precursor solution has a PZT density of 0.3 [mol/l]. The PZT precursor solution is applied to the outermost surface of the multilayer film of the silicon wafer serving as the substrate by spin coating and subject to drying and pyrolysis with a hot plate. The PZT precursor solution is subject to application, drying, and pyrolysis three times to produce three layers. After the third pyrolysis to produce the third layer, thermal treatment for crystallization is performed by RTA. After thermal treatment for crystallization, the PZT film has a film thickness of about 250 nanometers. Processes of application of the PZT precursor solution, drying, pyrolysis, and thermal treatment for crystallization are performed eight times in total to produce 24 layers, thus obtaining the PZT film having a film thickness of about 2 micrometers. The {200} plane of the PZT film produced by the processes described above (hereinafter referred to as the PZT {200} plane) is subject to the X-ray diffraction measurement in 2θ-ω scan.

In the first example, a plurality of PZT films is produced by the processes described above and subject to the X-ray diffraction measurement in 2θ-ω scan. Among the plurality of PZT films, a PZT film having a full width at half maximum corresponding to the PZT {200} plane (e.g., a range of an angle ω) of 10.02 degrees is selectively used.

Subsequently, the Pt film, serving as a second electrode, having a film thickness of about 150 nanometers is produced on the PZT film by spattering. Spattering is performed at a temperature of the substrate of 300 degrees centigrade. Thereafter, a photoregist TSMR8800 available from Tokyo Ohka Kogyo Co., Ltd. is coated by spin coating to produce a regist pattern by typical photolithography. Subsequently, a pattern is created by using an inductively coupled plasma (ICP) etching device available from SAMCO Inc.

Next, in order to produce a pressure chamber, anisotropic wet etching is conducted using an alkaline solution (e.g., a KOH solution or a trimethyl hexyl ammonium (TMHA) solution). Accordingly, the pressure chamber having a width of 60 micrometers in a short direction thereof is created. Thus, the droplet ejection head 94 shown in FIG. 4 that incorporates a piezoelectric actuator (e.g., a thin film PZT actuator) serving as an electromechanical piezoelectric element incorporating the PZT film 406 is manufactured.

A detailed description is now given of a second example of the method for manufacturing the droplet ejection head 94.

In the second example, among the plurality of PZT films produced by the method of the first example described above, a PZT film having a full width at half maximum corresponding to the PZT {200} plane (e.g., a range of an angle ω) obtained by the X-ray diffraction measurement in 2θ-ω scan of 7.12 degrees is selectively used. Thus, the droplet ejection head 94 is manufactured by the method of the first example described above.

A detailed description is now given of a third example of the method for manufacturing the droplet ejection head 94.

In the third example, among the plurality of PZT films produced by the method of the first example described above, a PZT film having a full width at half maximum corresponding to the PZT {200} plane (e.g., a range of an angle ω) obtained by the X-ray diffraction measurement in 2θ-ω scan of 5.32 degrees is selectively used. Thus, the droplet ejection head 94 is manufactured by the method of the first example described above.

A detailed description is now given of a first comparative example of a method for manufacturing a first comparative, droplet ejection head.

In the first comparative example, among the plurality of PZT films produced by the method of the first example described above, a PZT film having a full width at half maximum corresponding to the PZT {200} plane (e.g., a range of an angle ω) obtained by the X-ray diffraction measurement in 2θ-ω scan of 11.56 degrees is selectively used. Thus, the first comparative, droplet ejection head is manufactured by the method of the first example described above.

A detailed description is now given of a second comparative example of a method for manufacturing a second comparative, droplet ejection head.

In the second comparative example, among the plurality of PZT films produced by the method of the first example described above, a PZT film having a full width at half maximum corresponding to the PZT {200} plane (e.g., a range of an angle ω) obtained by the X-ray diffraction measurement in 2θ-ω scan of 12.61 degrees is selectively used. Thus, the second comparative, droplet ejection head is manufactured by the method of the first example described above.

A detailed description is now given of a third comparative example of a method for manufacturing a third comparative, droplet ejection head.

In the third comparative example, after the adhesion layer made of $TiO_2$ and the electrode layer made of platinum are produced on the diaphragm in the first example described above, a film made of strontium ruthenate (SRO) having a film thickness of 60 nanometers is produced. On the strontium rhthenate film, a PZT film in which the {111} plane is preferentially oriented to be orthogonal to the thickness direction of the PZT film is produced. Among a plurality of PZT films produced by this method, a PZT film having a full width at half maximum (e.g., a range of an angle ω) corresponding to a {111} plane of the PZT film (hereinafter referred to as the PZT {111} plane) obtained by the X-ray diffraction measurement in 2θ-ω scan of 2.15 degrees is selectively used. Thus, the third comparative, droplet ejection head is manufactured by the method of the first example described above.

A description is provided of evaluation of the full width at half maximum corresponding to the PZT film obtained by the X-ray diffraction measurement in 2θ-ω scan in the first to third examples and the first to third comparative examples described above.

The X-ray diffraction measurement in 2θ-ω scan is conducted for the PZT film in a range described in a formula (2) below.

$$20[°] \leq \theta \leq 50[°] \quad (2)$$

The value θ is determined based on the peak for each of the PZT {200} plane and the PZT {111} plane. Based on the determined value θ, an incident angle of X-ray varies in a range described in a formula (3) below for the X-ray diffraction measurement in 2θ-ω scan.

$$\omega = \theta \pm 15[°] \quad (3)$$

The measurement is conducted with an XRD device X'Pert Pro available from Royal Philips under an X-ray source of CuKα, an X-ray wavelength of 1.541 angstrom (0.1541 nanometers), and Slit ½.

A description is provided of evaluation of deformation (e.g., surface displacement) and degradation of the piezoelectric actuator.

A driving voltage having a pulse wavelength defined by an application electric field of 150 [kV/cm], a risetime of 1 microsecond, a falltime of 1 microsecond, a pulse width of 4 microseconds, and a repetition frequency of 100 [kHz] is applied to the droplet ejection head 94 produced in the first to third examples and the first to third comparative examples. As the driving voltage having the pulse wavelength is applied to the piezoelectric actuator (e.g., the PZT element) to drive the piezoelectric actuator continuously, change in surface displacement over time of the piezoelectric actuator is evaluated. Surface displacement of the piezoelectric actuator is measured with a laser doppler vibrometer. An absolute value of a default amount of surface displacement of the piezoelectric actuator initially measured after manufacturing defines 100 percent. Thereafter, the driving voltage having the pulse wavelength described above is applied repeatedly by $10^9$ times and a decreasing rate in surface displacement of the piezoelectric actuator is evaluated. As an index value defining an acceptability criterion of the evaluation, the default amount of surface displacement of the piezoelectric actuator is not smaller than 0.26 micrometers at or above which the piezoelectric actuator ejects droplets sufficiently. Degradation in surface displacement of the piezoelectric actuator is defined within 5 percent at or below which the droplet ejection head 94 attains droplet ejection performance.

Table 1 below shows evaluation results of the first to third examples and the first to third comparative examples. Table 1 shows a main orientation plane, a full width at half maximum in the X-ray diffraction measurement in 2θ-ω scan (hereinafter referred to as the full width at half maximum), a default amount of surface displacement of the piezoelectric actuator initially measured after manufacturing, and a decreasing rate of an amount of surface displacement of the piezoelectric actuator after the predetermined driving defined above. It is to be noted that the full width at half maximum in table 1 is for the PZT {200} plane in the first to third examples and the first and second comparative examples in which the main orientation plane is the {100} plane. Conversely, the full width at half maximum in table 1 is for the PZT {111} plane in the third comparative example in which the main orientation plane is the {111} plane.

TABLE 1

| | Main orientation plane | Full width at half maximum (°) | Default amount of surface displacement (μm) | Decreasing rate (%) |
|---|---|---|---|---|
| First example | {100} | 10.02 | 0.279 | 4.97 |
| Second example | {100} | 7.12 | 0.273 | 3.86 |
| Third example | {100} | 5.32 | 0.269 | 3.12 |
| First comparative example | {100} | 11.56 | 0.285 | 8.73 |
| Second comparative example | {100} | 12.61 | 0.291 | 14.82 |
| Third comparative example | {111} | 2.15 | 0.181 | 2.95 |

As shown in table 1, in the first to third examples and the third comparative example in which the full width at half maximum corresponding to the PZT {200} plane is equivalent to or smaller than 10 degrees, the decreasing rate of the amount of surface displacement of the piezoelectric actuator after continuous driving is not greater than 5 percent. Contrarily, in the first and second comparative example in which the full width at half maximum corresponding to the PZT {200} plane is greater than 10 degrees, the decreasing rate of the amount of surface displacement of the piezoelectric actuator after continuous driving is greater than 8 percent.

Further, in the first to third examples in which the full width at half maximum corresponding to the PZT {200} plane is not smaller than 5 degrees, the default amount of surface displacement of the piezoelectric actuator is not smaller than 0.26 micrometers at or above which the piezoelectric actuator is displaced sufficiently to eject droplets.

It is to be noted that the decreasing rate of the amount of surface displacement of the piezoelectric actuator after continuous driving for $10^9$ times is not greater than 5 percent and the default amount of surface displacement is not smaller than 0.26 micrometers also under application conditions i) to v) of the pulse wavelength defined below.

i) Application electric field (peak): not greater than 250 [kV/cm]

ii) Risetime: not smaller than 1 microsecond and not greater than 5 microseconds iii) Falltime: not smaller than 1 microsecond and not greater than 5 microseconds iv) Pulsewidth: not smaller than 1 microsecond and not greater than 10 microseconds v) Repetition frequency: not greater than 200 [kHz]

Figure 5:
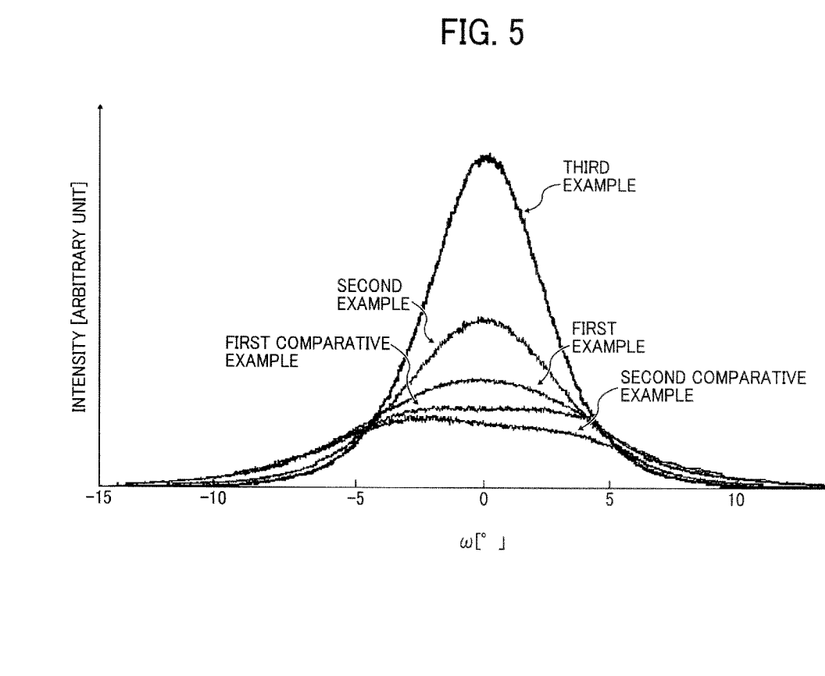
FIG. 5 is a graph illustrating one example of results of the X-ray diffraction measurement in 2θ-ω scan performed for the {200} plane of the PZT film in first to third examples and first and second comparative examples.

FIG. 5 is a graph illustrating one example of results of the X-ray diffraction measurement in 2θ-ω scan performed for the PZT {200} plane in the first to third examples and the first and second comparative examples. As shown in FIG. 5, in the first and second comparative examples in which the decreasing rate of the amount of surface displacement over time of the piezoelectric actuator is greater than 8 percent, two maximum values resulting from the domain in the (001) orientation and the domain in the (100) orientation, respectively, appear. Conversely, in the first to third examples in which the decreasing rate of the amount of surface displacement over time of the piezoelectric actuator is not greater than 5 percent, a peak resulting from the domain in the (001) orientation appears. The results of the measurement shown in FIG. 5 show that a single maximum value of a peak for the PZT {200} plane is one factor that decreases the full width at half maximum corresponding to the PZT {200} plane.

Figure 6:
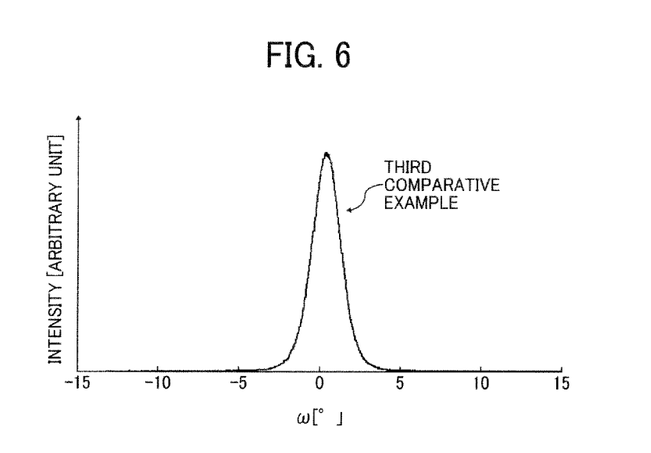
FIG. 6 is a graph illustrating one example of results of the X-ray diffraction measurement in 2θ-ω scan performed for a {111} plane of the PZT film in a third comparative example.

FIG. 6 is a graph illustrating one example of results of the X-ray diffraction measurement in 2θ-ω scan performed for the PZT {111} plane in the third comparative example. The piezoelectric actuator of the third comparative example shown in FIG. 6 has the PZT {111} plane orthogonal to the thickness direction of the PZT film. In the third comparative example, the full width at half maximum corresponding to the PZT {111} plane obtained by the X-ray diffraction measurement in 2θ-ω scan is small as shown in FIG. 6. Hence, the decreasing rate of the amount of surface displacement over time of the piezoelectric actuator is suppressed to 5 percent or smaller. However, the default amount of surface displacement of the PZT film in the {111} orientation is smaller than that of the PZT film in the {100} orientation. Accordingly, the piezoelectric actuator of the third comparative example that has the PZT film in the {111} orientation has the default amount of surface displacement which is smaller than that of the piezoelectric actuator of the first to third examples and the first and second comparative examples that has the PZT film in the {100} orientation.

The above-described results of the measurement of the first to third examples and the first to third comparative examples show a configuration of the piezoelectric actuator that prevents decrease in deformation over time of the PZT film. For example, the piezoelectric actuator employs the PZT film in the {100} orientation in which the {100} plane is preferentially oriented to be orthogonal to the thickness direction of the PZT film. The full width at half maximum corresponding to the {200} plane obtained by the X-ray diffraction measurement in 2θ-ω scan performed on the PZT film is not smaller than 5 degrees and not greater than 10 degrees. The piezoelectric actuator incorporating the PZT film having those properties prevents decrease in an amount of deformation, that is, the amount of surface displacement, over time caused by repeated driving of the piezoelectric actuator while increasing piezoelectricity and the default amount of deformation or surface displacement of the PZT film.

Figure 7:
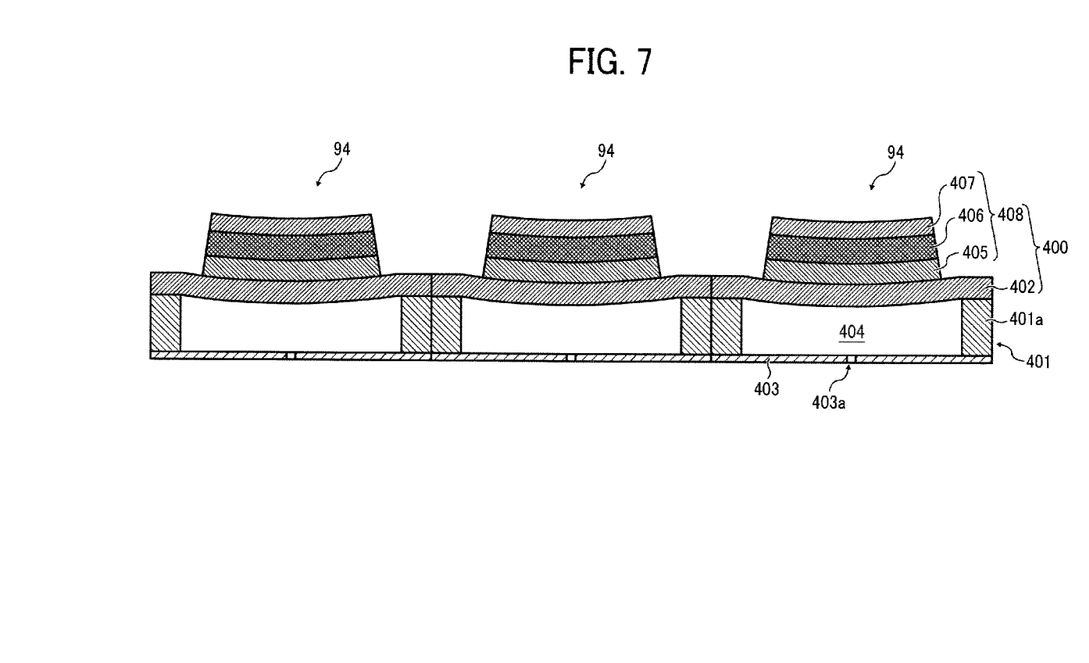
FIG. 7 is a schematic sectional view of a plurality of droplet ejection heads according to another exemplary embodiment of the present disclosure.

With reference to FIG. 7, a description is provided of a configuration having a plurality of droplet ejection heads 94.

FIG. 7 is a schematic sectional view of the plurality of droplet ejection heads 94. As shown in FIG. 7, each of the plurality of droplet ejection heads 94 includes the piezoelectric actuator having the PZT film 406 shown in FIG. 4. With the configuration shown in FIG. 7, the piezoelectric actuator as the electromechanical transducer 408 that attains performance equivalent to that of bulk ceramics is manufactured with simple processes. Thereafter, etching is removed from a back face of the electromechanical transducer 408 to produce the pressure chamber 404 and the nozzle plate 403 produced with the nozzle 403a. The nozzle plate 403 is attached to the electromechanical transducer 408 through the substrate 401 and the diaphragm 402. Thus, the plurality of droplet ejection heads 94 is produced collectively. It is to be noted that FIG. 7 omits illustration of a liquid supply, a liquid channel, and a liquid resistance.

Figure 8:
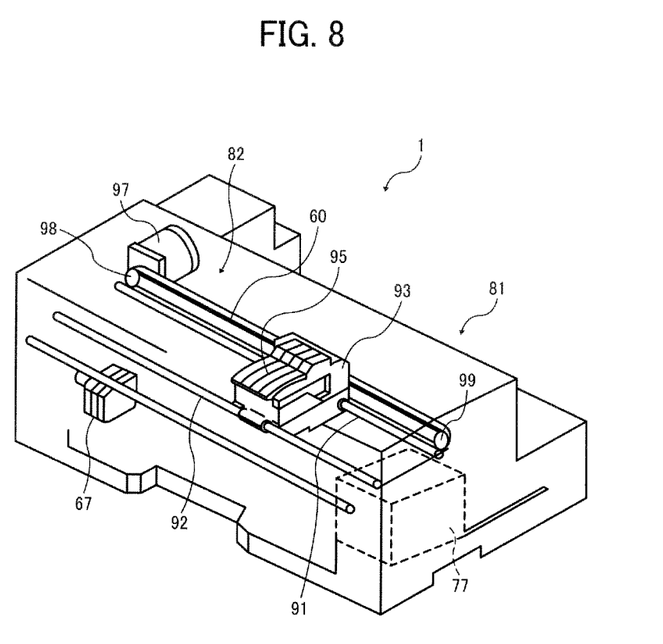
FIG. 8 is a perspective view of an inkjet recording apparatus incorporating the plurality of droplet ejection heads shown in FIG. 7.
Figure 9:
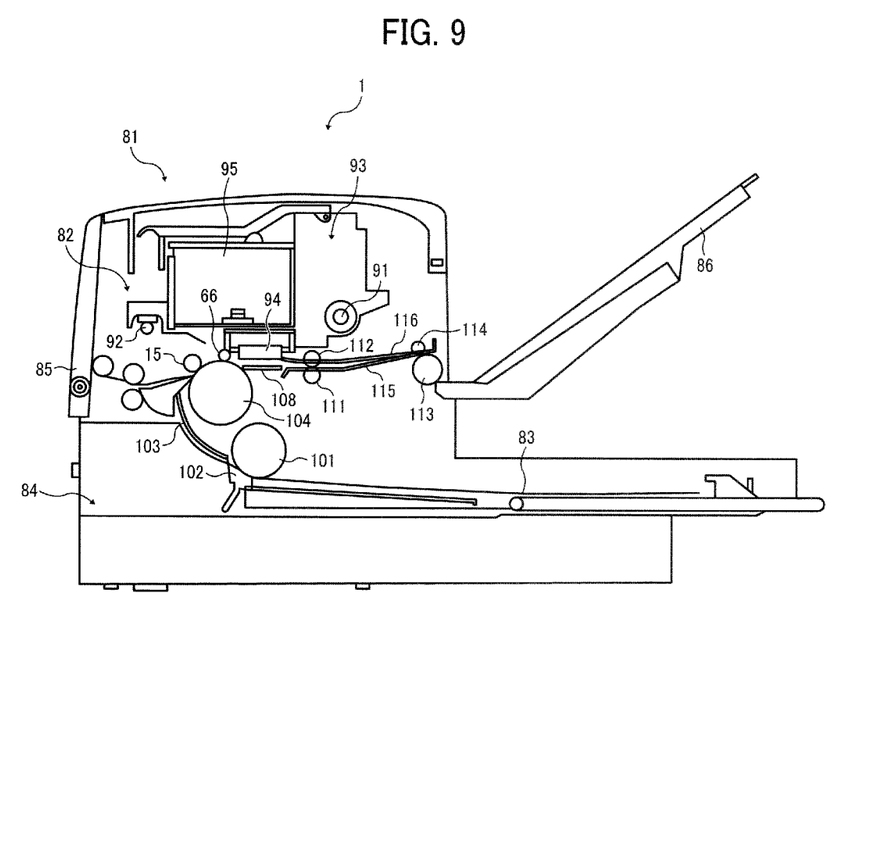
FIG. 9 is a sectional side view of the inkjet recording apparatus shown in FIG. 8.

With reference to FIGS. 8 and 9, a description is provided of a construction of an inkjet recording apparatus 1 serving as an image forming apparatus or a droplet ejection apparatus that incorporates the droplet ejection head 94 shown in FIG. 4 or the plurality of droplet ejection heads 94 shown in FIG. 7.

FIG. 8 is a perspective view of the inkjet recording apparatus 1. FIG. 9 is a sectional side view of the inkjet recording apparatus 1.

The inkjet recording apparatus 1 may be a copier, a facsimile machine, a printer, a multifunction peripheral or a multifunction printer (MFP) having at least one of copying, printing, scanning, facsimile, and plotter functions, or the like. According to this exemplary embodiment, the inkjet recording apparatus 1 is a color printer that forms color and monochrome images on recording media by an inkjet method.

As shown in FIG. 9, the inkjet recording apparatus 1 includes a body 81 accommodating a printing device 82. The printing device 82 includes a carriage 93 movable in a main scanning direction, the droplet ejection heads 94 mounted on the carriage 93, and ink cartridges 95 serving as liquid cartridges that supply ink, serving as liquid used to form an image on a sheet 83, to the droplet ejection heads 94. In a lower portion of the body 81 is a paper tray 84 or a paper cassette loading a plurality of sheets 83 serving as recording media. The paper tray 84 is detachably attached to the body 81 at a front of the inkjet recording apparatus 1. As a bypass tray 85 is lowered, the bypass tray 85 loads a plurality of sheets 83. As the inkjet recording apparatus 1 receives a print job, a sheet 83 is conveyed from the paper tray 84 or the bypass tray 85, the printing device 82 forms an image on the sheet 83, and the sheet 83 bearing the image is discharged onto an output tray 86 attached to a rear of the inkjet recording apparatus 1.

As shown in FIG. 8, a main guide rod 91 and a sub guide rod 92 serving as guides are mounted on both side plates of the printing device 82 at both axial ends of the main guide rod 91 and the sub guide rod 92. The carriage 93 is supported by the main guide rod 91 and the sub guide rod 92 such that the carriage 93 is slidable over the main guide rod 91 and the sub guide rod 92 in the main scanning direction. The carriage 93 mounts the plurality of droplet ejection heads 94 such that the plurality of nozzles 403a depicted in FIG. 7, serving as ejection ports, is aligned in a direction perpendicular to the main scanning direction and is directed downward to eject ink droplets downward. The plurality of droplet ejection heads 94 is a plurality of inkjet heads that ejects yellow, cyan, magenta, and black ink droplets, respectively. The ink cartridges 95, detachably attached to the carriage 93 for replacement, supply yellow, cyan, magenta, and black ink to the droplet ejection heads 94, respectively.

Each of the ink cartridges 95 includes an air communication port in communication with air at an upper portion of the ink cartridge 95, a supply port that supplies ink to the droplet ejection head 94 at a lower portion of the ink cartridge 95, and a porous body filled with ink at an inside of the ink cartridge 95. A capillary force of the porous body retains slightly negative pressure of ink to be supplied to the droplet ejection head 94. The inkjet recording apparatus 1 incorporates the four droplet ejection heads 94. Alternatively, the inkjet recording apparatus 1 may incorporate a single droplet ejection head having a plurality of nozzles that ejects droplets in a plurality of colors.

As shown in FIG. 8, a rear portion of the carriage 93, that is, a downstream portion of the carriage 93 in a sheet conveyance direction, slidably engages the main guide rod 91. A front portion of the carriage 93, that is, an upstream portion of the carriage 93 in the sheet conveyance direction, slidably sits on the sub guide rod 92. A timing belt 60 is looped over a driving pulley 98 and a driven pulley 99. A main scan motor 97 drives and rotates the driving pulley 98. The timing belt 60 mounts the carriage 93. As the main scan motor 97 rotates forward and backward, the carriage 93 mounted on the timing belt 60 moves reciprocally in the main scanning direction.

As shown in FIG. 9, in order to convey the sheet 83 from the paper tray 84 to a lower portion of the droplet ejection heads 94, a feed roller 101 and a friction pad 102 pick up and feed the sheet 83 from the paper tray 84 to a roller nip formed between a conveyance roller 104 and a regulation roller 66 through a guide 103. For example, the feed roller 101 and the friction pad 102 separate an uppermost sheet 83 from other sheets 83 loaded on the paper tray 84 and feed the uppermost sheet 83 to the guide 103. The guide 103 guides the sheet 83 to the conveyance roller 104. The conveyance roller 104 reverses and conveys the sheet 83. The regulation roller 66 regulates the angle of the sheet 83 conveyed by the conveyance roller 104 and a conveyance roller 15 that presses the sheet 83 against an outer circumferential surface of the conveyance roller 104. The conveyance roller 104 is driven and rotated by a sub scan motor 67 depicted in FIG. 8 through a gear train.

As shown in FIG. 9, a platform 108 serving as a sheet guide is disposed opposite the lower portion of the droplet ejection heads 94 and spans a moving span of the carriage 93 movable in the main scanning direction. The platform 108 guides the sheet 83 conveyed by the conveyance roller 104. Downstream from the platform 108 in the sheet conveyance direction are a conveyance roller 111 and a spur 112 that are driven and rotated to convey the sheet 83 toward the output tray 86. Downstream from the conveyance roller 111 and the spur 112 in the sheet conveyance direction are guides 115 and 116 that create an output path and an output roller 113 and a spur 114 that feed the sheet 83 to the output tray 86.

During printing, while the carriage 93 moves in the main scanning direction, the droplet ejection heads 94 are driven according to an image signal to eject ink onto the sheet 83 that halts below the droplet ejection heads 94, thus performing single line recording on the sheet 83. Thereafter, the sheet 83 is conveyed for a predetermined amount and the droplet ejection heads 94 perform another single line recording on the sheet 83. Upon receipt of a recording finishing signal or a signal indicating that a trailing edge of the sheet 83 reaches a recording region where the droplet ejection heads 94 eject ink onto the sheet 83, the droplet ejection heads 94 finish printing and the sheet 83 is discharged onto the output tray 86.

As shown in FIG. 8, a recovery device 77 is disposed outboard from the recording region in the main scanning direction in which the carriage 93 moves, that is, at a right portion of the inkjet recording apparatus 1. The recovery device 77 recovers the droplet ejection heads 94 from faulty ejection of ink. The recovery device 77 includes a cap, a suction device, and a cleaner. When the inkjet recording apparatus 1 is in a standby mode in which the inkjet recording apparatus 1 waits for a print job, the carriage 93 moves to a position above the recovery device 77 where the cap caps each droplet ejection head 94 to retain the nozzle 403a of the droplet ejection head 94 moistened, thus preventing drying of ink on the nozzle 403a and resultant faulty ejection of ink. Additionally, during printing, the droplet ejection heads 94 perform dummy ejection of ink that does not form an image on the sheet 83 to even the viscosity of ink at the nozzles 403a through which ink is ejected, thus maintaining ejection performance.

When faulty ejection occurs, the cap seals the nozzles 403a of the droplet ejection heads 94, the suction device sucks bubbles and the like together with ink from the nozzles 403a through tubes, and the cleaner removes ink, a contaminant, and the like from the nozzles 403a, thus recovering the droplet ejection heads 94 from faulty ejection of ink. Ink sucked by the recovery device 77 is discharged into a waste ink container situated in the lower portion of the body 81 and absorbed into an ink absorber inside the waste ink container.

The inkjet recording apparatus 1 incorporates the droplet ejection head 94 having the construction described above with reference to FIGS. 4 and 7 and produced by the methods according to the first and third examples. Accordingly, the droplet ejection head 94 is immune from faulty ejection of ink droplets due to faulty driving of the diaphragm 402. Further, fluctuation in surface displacement of the piezoelectric actuator is suppressed, attaining stable ink ejection performance and improving quality of the image formed on the sheet 83.

The inkjet recording apparatus 1 serving as an image forming apparatus forms the image on the sheet 83 by landing droplets ejected from the droplet ejection heads 94 on the sheet 83. Alternatively, the droplet ejection heads 94 are applicable to droplet ejection apparatuses other than the inkjet recording apparatus 1 serving as the image forming apparatus. For example, media (e.g., a recording medium, a transfer sheet, and a recording sheet) on which droplets land to form an image include paper, strings, fiber, cloth, leather, metal, plastic, glass, wood, and ceramics. An image formed by the image forming apparatus includes a character, a letter, graphics, and a pattern without a specific meaning. That is, the image forming apparatus may be an apparatus that merely ejects droplets. Further, the droplet ejection head 94 is applicable to an apparatus that ejects liquid resist for patterning onto a medium, a droplet ejection apparatus that ejects a gene analysis sample onto a medium or produces three-dimensional molding.

A description is provided of aspects and advantages of the exemplary embodiments and the first to third examples described above.

A description is now given of an aspect A. As shown in FIG. 4, the electromechanical transducer 408 such as an actuator element includes a first electrode, that is, the lower electrode 405, mounted on the substrate 401 or the base film 409; an electromechanical transducer film, that is, the PZT film 406, mounted on the first electrode and made of a piezoelectric substance having the perovskite crystal structure; and a second electrode, that is, the upper electrode 407, mounted on the electromechanical transducer film. The electromechanical transducer film includes the {100} plane preferentially oriented to be orthogonal to the thickness direction of the electromechanical transducer film. The full width at half maximum corresponding to the {200} plane in an X-ray diffraction measurement curve in 2θ-ω scan that is measured by emitting an X-ray beam onto a surface of the electromechanical transducer film at an incident angle θ is not greater than 10 degrees.

Accordingly, as described above in the exemplary embodiments and the first to third examples, decrease in the amount of deformation over time of the electromechanical transducer film made of the piezoelectric substance having the perovskite crystal structure, as voltage is applied to the electromechanical transducer film, is suppressed. For example, the full width at half maximum corresponding to the {200} plane in the X-ray diffraction measurement curve in 2θ-ω scan of the electromechanical transducer film having the preferentially oriented {100} plane is not greater than 10 degrees. Accordingly, when a voltage having a predetermined pulse wavelength is applied to the electromechanical transducer incorporating the electromechanical transducer film repeatedly by $10^9$ times, degradation in the amount of deformation over time of the electromechanical transducer film, as it is applied with voltage, is suppressed to a level at which the amount of surface displacement of the electromechanical transducer film is within 5 percent of the default amount of surface displacement.

The predetermined pulse wavelength satisfies the conditions i) to v) below.

i) Application electric field (peak): not greater than 250 [kV/cm]

ii) Risetime: not smaller than 1 microsecond and not greater than 5 microseconds iii) Falltime: not smaller than 1 microsecond and not greater than 5 microseconds iv) Pulsewidth: not smaller than 1 microsecond and not greater than 10 microseconds v) Repetition frequency: not greater than 200 [kHz]

A description is now given of an aspect B.

In the aspect A, the electromechanical transducer film has the full width at half maximum corresponding to the {200} plane in the X-ray diffraction measurement curve in 2θ-ω scan that is not smaller than 5 degrees.

Accordingly, as described above in the exemplary embodiments and the first to third examples, the amount of deformation of the electromechanical transducer film made of the piezoelectric substance having the perovskite crystal structure, as voltage is applied to the electromechanical transducer film in the early stage after manufacturing, is increased. For example, the full width at half maximum corresponding to the {200} plane in the X-ray diffraction measurement curve in 2θ-ω scan of the electromechanical transducer film having the preferentially oriented {100} plane is not smaller than 5 degrees. Accordingly, when the voltage having the predetermined pulse wavelength is applied to the electromechanical transducer incorporating the electromechanical transducer film, the default amount of deformation of the electromechanical transducer film is increased to a level at which the amount of surface displacement of the electromechanical transducer film in the early stage after manufacturing is not smaller than 0.26 micrometers.

A description is now given of an aspect C.

In the aspect A or B, a peak corresponding to the {200} plane has a single maximum point. Accordingly, as described above in the exemplary embodiments, among the {100} planes orthogonal to the thickness direction of the electromechanical transducer film, the orientation rate of the (100) plane is increased, suppressing decrease in the amount of deformation over time of the electromechanical transducer film as voltage is applied to the electromechanical transducer film.

A description is now given of an aspect D.

In any one of the aspects A to C, the base film is the titanium oxide ($TiO_2$) film. Accordingly, as described above in the exemplary embodiments, if the substrate mounts the $SiO_2$ layer and the first electrode is made of the Pt film, the $SiO_2$ layer adheres to the Pt film closely.

A description is now given of an aspect E.

In any one of the aspects A to D, the first electrode includes the Pt film. Accordingly, as described above in the exemplary embodiments, the first electrode improves its heat resistance and decreases its reactivity.

A description is now given of an aspect F.

As shown in FIG. 4, the droplet ejection head 94 includes the nozzle 403a, the pressure chamber 404 in communication with the nozzle 403a, and the pressure generator 400 that presses against liquid in the pressure chamber 404. The pressure generator 400 includes the electromechanical transducer 408 in any one of the aspects A to E.

Accordingly, as described above in the exemplary embodiments, decrease in the amount of deformation over time of the electromechanical transducer film that presses against liquid in the pressure chamber 404, as voltage is applied to the electromechanical transducer film, is suppressed, thus suppressing degradation over time in droplet ejection performance to eject droplets from the nozzle 403a.

A description is now given of an aspect G.

As shown in FIGS. 8 and 9, the droplet ejection apparatus, that is, the inkjet recording apparatus 1, includes the droplet ejection head 94 in the aspect F. Accordingly, as described above in the exemplary embodiments, the droplet ejection apparatus suppresses degradation over time in droplet ejection performance.

A description is now given of an aspect H.

As shown in FIGS. 8 and 9, the image forming apparatus, that is, the inkjet recording apparatus 1, includes the droplet ejection head 94 in the aspect F. Accordingly, as described above in the exemplary embodiments, the image forming apparatus suppresses degradation over time in droplet ejection performance and forms a high quality image on a recording medium stably for an extended period of time.

A description is now given of an aspect I.

A method for manufacturing the electromechanical transducer includes a step of producing the first electrode on the substrate 401 or the base film 409 and a step of producing the electromechanical transducer film on the first electrode. The electromechanical transducer film is made of the piezoelectric substance having the perovskite crystal structure in which the {100} plane as a crystal plane is preferentially oriented to be orthogonal to the thickness direction of the electromechanical transducer film. The full width at half maximum corresponding to the {200} plane in the measurement curve in 2θ-ω scan using X-ray diffraction that is measured by emitting an X-ray beam onto a surface of the electromechanical transducer film at the incident angle θ is not greater than 10 degrees.

Accordingly, as described above in the exemplary embodiments, as voltage is applied to the electromechanical transducer film, decrease in the amount of deformation over time of the electromechanical transducer film made of the piezoelectric substance having the perovskite crystal structure, upon application of voltage to the electromechanical transducer film, is suppressed.

Numerous additional modifications and variations are possible in light of the above teachings. It is therefore to be understood that, within the scope of the appended claims, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

What is claimed is:

1. An electromechanical transducer comprising:
   a first electrode mounted on one of a substrate and a base film;
   an electromechanical transducer film mounted on the first electrode and made of a piezoelectric substance having a perovskite crystal structure; and
   a second electrode mounted on the electromechanical transducer film,
   the electromechanical transducer film including a {100} plane preferentially oriented to be orthogonal to a thickness direction of the electromechanical transducer film and having a full width at half maximum corresponding to a {200} plane in an X-ray diffraction measurement curve in 2θ-ω scan that is measured by emitting an X-ray beam onto a surface of the electromechanical transducer film while diffraction angle 2θ is fixed and the X-ray beam is scanned at incident angle ω that changes, the full width at half maximum being not greater than 10 degrees.

2. The electromechanical transducer according to claim 1, wherein the full width at half maximum is not smaller than 5 degrees.

3. The electromechanical transducer according to claim 1, wherein a peak corresponding to the {200} plane has a single maximum point.

4. The electromechanical transducer according to claim 1, wherein the base film is a titanium oxide film.

5. The electromechanical transducer according to claim 1, wherein the first electrode includes a platinum film.

6. A droplet ejection head comprising:
   a nozzle to eject liquid;
   a pressure chamber, in communication with the nozzle, to contain the liquid; and
   a pressure generator to press against the liquid in the pressure chamber, the pressure generator including:
   a diaphragm abutting the pressure chamber to press against the liquid in the pressure chamber; and
   an electromechanical transducer mounted on the diaphragm, the electromechanical transducer including:
     a first electrode mounted on one of a substrate and a base film;
     an electromechanical transducer film mounted on the first electrode and made of a piezoelectric substance having a perovskite crystal structure; and
     a second electrode mounted on the electromechanical transducer film,
   the electromechanical transducer film including a {100} plane preferentially oriented to be orthogonal to a thickness direction of the electromechanical transducer film and having a full width at half maximum corresponding to a {200} plane in an X-ray diffraction measurement curve in 2θ-ω scan that is measured by emitting an X-ray beam onto a surface of the electromechanical transducer film while diffraction angle 2θ is fixed and the X-ray beam is scanned at incident angle ω that changes, the full width at half maximum being not greater than 10 degrees.

* * * * *